(12) United States Patent
Yang et al.

(10) Patent No.: US 8,190,961 B1
(45) Date of Patent: May 29, 2012

(54) SYSTEM AND METHOD FOR USING PILOT SIGNALS IN NON-VOLATILE MEMORY DEVICES

(75) Inventors: Xueshi Yang, Sunnyvale, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 1218 days.

(21) Appl. No.: 11/986,872

(22) Filed: Nov. 27, 2007

Related U.S. Application Data

(60) Provisional application No. 60/867,492, filed on Nov. 28, 2006.

(51) Int. Cl.
*H03M 13/05* (2006.01)
*H03M 13/33* (2006.01)
(52) U.S. Cl. .................. 714/752; 714/718
(58) Field of Classification Search .............. None
See application file for complete search history.

(56) References Cited

U.S. PATENT DOCUMENTS

| | | | | |
|---|---|---|---|---|
| 4,553,213 A | * | 11/1985 | Hyatt | 332/185 |
| 5,251,079 A | * | 10/1993 | Yamada et al. | 360/77.14 |
| 5,825,243 A | * | 10/1998 | Sato et al. | 329/311 |
| 6,285,655 B1 | * | 9/2001 | Lundby et al. | 370/209 |
| 6,604,218 B1 | * | 8/2003 | Hisatomi et al. | 714/755 |
| 6,816,545 B1 | * | 11/2004 | Davis et al. | 375/222 |
| 6,990,153 B1 | * | 1/2006 | Farhang-Boroujeni et al. | 375/260 |
| 7,027,375 B2 | * | 4/2006 | Shimizu | 369/59.12 |
| 7,174,440 B2 | * | 2/2007 | Chang et al. | 711/202 |
| 7,315,531 B2 | * | 1/2008 | Black et al. | 370/335 |
| 2006/0269016 A1 | * | 11/2006 | Long et al. | 375/340 |
| 2007/0171714 A1 | | 7/2007 | Wu et al. | |

FOREIGN PATENT DOCUMENTS

JP 2002008379 A * 1/2002

* cited by examiner

*Primary Examiner* — Cynthia Britt
*Assistant Examiner* — Dipakkumar Gandhi

(57) ABSTRACT

A memory system includes a selector module that selects and switches between one of N sequences of signal levels for pilot data. The N sequences are different, and N is an integer greater than 1. A multiplexer module selectively combines data and the pilot data and outputs a combined signal. A write module writes to memory based on the combined signal.

42 Claims, 14 Drawing Sheets

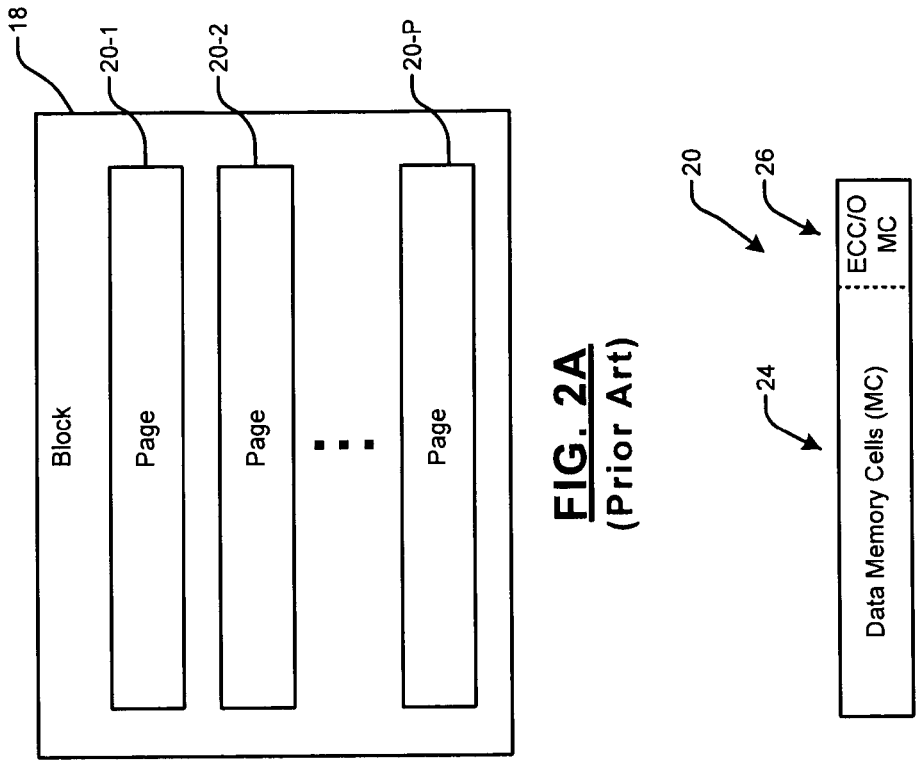
FIG. 2A
(Prior Art)
FIG. 2B
(Prior Art)
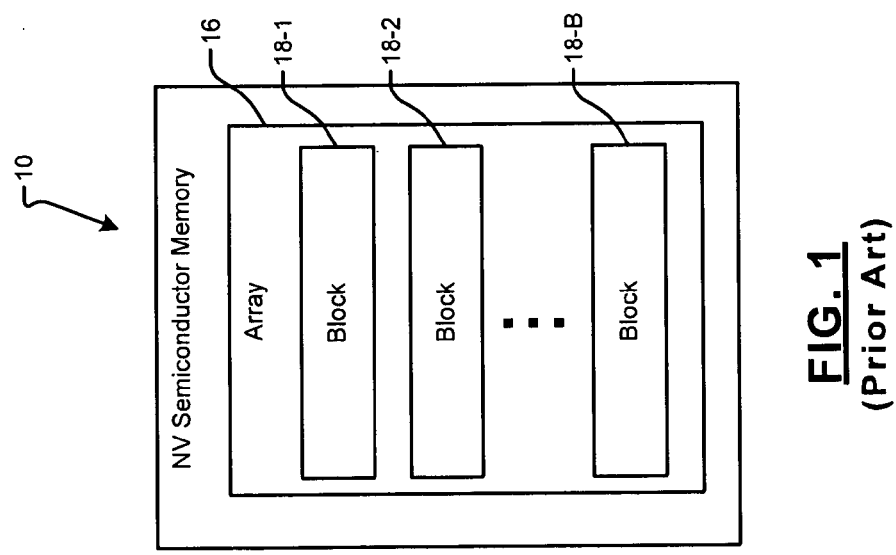
FIG. 1
(Prior Art)

SYSTEM AND METHOD FOR USING PILOT SIGNALS IN NON-VOLATILE MEMORY DEVICES

CROSS-REFERENCE TO RELATED APPLICATIONS

This application claims the benefit of U.S. Provisional Application No. 60/867,492, filed on Nov. 28, 2006. The disclosure of the above application is incorporated herein by reference in its entirety.

FIELD

The present disclosure relates to non-volatile memory devices and more particularly to using pilot signals in non-volatile memory devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIGS. 1, 2A and 2B, non-volatile semiconductor memory 10 may include flash memory, static random access memory (SRAM), nitride read only memory (NROM), phase change memory, magnetic RAM, multi-state memory, etc. The non-volatile semiconductor memory 10 may include one or more arrays 16. The arrays 16 may be arranged as B memory blocks 18-1, 18-2, . . . , and 18-B (collectively referred to as blocks 18).

In FIG. 2A, each block 18 includes P pages 20-1, 20-2, . . . , and 20-P (collectively referred to as pages 20). In FIG. 2B, each page 20 may include a plurality of memory cells that are associated with a data portion 24 and may include other memory cells that are associated with an overhead data portion 26 such as error correcting code (ECC) data or other (O) overhead data.

The non-volatile semiconductor memory 10 typically communicates with a memory control module of a host device. Usually, the control module addresses the memory using a hardwired block size. Pages in the block may also have a hardwired physical page size and may therefore be referred to as physical pages. The number of memory cells in the data and overhead portions 24 and 26, respectively may also be hardwired.

For example only, a NAND flash array may include 2048 blocks for a total of 2 Gigabytes (GB) of memory. Each block may include 128 kilobytes (kB) in 64 pages. Each page may include 2112 bytes. Of the 2112 bytes, 2048 bytes may be associated with the data portion and 64 bytes may be associated with the overhead portion. Each memory cell may store a bit. To erase data stored in the array, the memory control module typically requires either an entire block and/or an entire page to be erased.

In FIG. 2C, the memory block 18 includes physical pages 50-1, 50-2, . . . , and 50-P (collectively referred to as pages 50). Each page 50 includes Y memory cells (memory cells 46-1, 46-2, . . . , and 46-Y) for the data portion and Z memory cells (memory cells 46-(Y+1), 46(Y+2), . . . , and 46(Y+Z)) for the overhead portion, where Y and Z are fixed values for a particular memory control module. During a first write operation for a first write data block, the memory control module writes data to pages 50-1 and 50-2 and part of page 50-3. During a second write operation for a second write data block, data is written to pages 50-4 and 50-5 and part of page 50-6. The remaining memory cells in pages 50-3 and 50-6 are unused.

A logical page may include formatted start and end-points within one or more physical pages. Logical pages may be used when data to be stored in memory has a length that differs from a length of a physical page. In most cases, the logical page size and physical page size are different. Thus, one logical page may be segmented and saved in different physical pages.

Referring now to FIG. 2D, another memory block 60 is illustrated that includes both physical and logical pages. A memory control module (not shown) may format physical pages 50-1 to 50-6 to appear as logical pages 51-1 to 51-3 for read/write operations. In other words, data is written to memory blocks according to the logical pages instead of according to the physical pages.

SUMMARY

A memory system includes a selector module that selects and switches between one of N sequences of signal levels for pilot data. The N sequences are different, and N is an integer greater than 1. A multiplexer module selectively combines data and the pilot data and outputs a combined signal. A write module writes to memory based on the combined signal.

In other features, first and second of the N sequences include first and second respective subsequences. The first subsequence includes a highest one of the signal levels repeated M times, and the second subsequence includes a lowest one of the signal levels repeated M times, where M>1. The first and second of the N sequences include third and fourth respective subsequences. The third and fourth subsequences include S signal levels that are between the highest and lowest ones of the signal levels, where $S \geq 1$. The S signal levels are different and are repeated X times, where X is an integer greater than 1. The selector module selects from at least one of alternating between the N sequences and randomly selecting from the N sequences for subsequent write operations to multiple cells of the memory.

In other features, the system includes a generator module that generates the pilot data. An encoder module encodes the data before the data is combined with the pilot data, and a decoder module decodes the data after the data is combined with the pilot data. The encoder and decoder modules operate on the data according to at least one of a Reed Solomon scheme, a Bose-Chaudhuri-Hocquenghem (BCH) scheme, a Low Density Parity Check (LDPC) scheme, a Gray code scheme, and a combination of two or more of the BCH scheme, the LDPC scheme, and the Gray code scheme. The memory includes a plurality of pages. The plurality of pages include at least one of logical and physical pages.

In other features, a read module provides read-back data and read-back pilot data from the memory. The write module writes the pilot data to pilot cells and the data to data cells of the memory based on a predetermined distribution. The predetermined distribution includes at least one of an even distribution and a random distribution. For the even distribution the pilot cells are spaced evenly apart in the memory. The system further includes a format module that determines the predetermined distribution based on at least one of a size of the physical pages and a size of the logical pages. The memory includes multilevel flash memory In other features, the system includes a demultiplexer module that demultiplexes the read-back pilot data and the read-back data. An estimation module estimates characteristics of pilot cells based on the read-back pilot data. A neighbor-finder module processes the read-back data based on the estimated characteristics. The estimation module estimates the characteristics through a least-mean square (LMS) operation. The system further includes a signal processing module that compensates for variations between written data and the read-back data.

In other features, a read module determines which of the N sequences was selected for the write to the memory. The read module determines which of the N sequences was selected for the write to the memory based on detection of at least one of the highest one of the signal levels repeated M times and the lowest one of the signal levels repeated M times. The signal levels include pulse-amplitude modulation (PAM) levels.

In other features, a method for operating a memory system includes selecting and switching between one of N sequences of signal levels for pilot data. The N sequences are different. N is an integer greater than 1. The method also includes generating a combined signal based on selectively combining data and the pilot data and writing to memory based on the combined signal.

In other features, the method includes generating first and second of the N sequences including first and second respective subsequences. The first subsequence includes a highest one of the signal levels repeated M times, and the second subsequence includes a lowest one of the signal levels repeated M times, where M>1. The first and second of the N sequences include third and fourth respective subsequences. The third and fourth subsequences include S signal levels that are between the highest and lowest ones of the signal levels, where S≧1. The S signal levels are different and are repeated X times, where X is an integer greater than 1.

In other features, the method includes selecting at least one of alternating between the N sequences and randomly selecting from the N sequences for subsequent write operations to multiple cells of the memory. The method also includes generating the pilot data. The method also includes encoding the data before the data is combined with the pilot data and decoding the data after the data is combined with the pilot data. The method also includes encoding and decoding the data according to at least one of a Reed Solomon scheme, a Bose-Chaudhuri-Hocquenghem (BCH) scheme, a Low Density Parity Check (LDPC) scheme, a Gray code scheme, and a combination of two or more of the BCH scheme, the LDPC scheme, and the Gray code scheme.

In other features, the method includes providing read-back data and read-back pilot data from the memory. The method also includes writing the pilot data to pilot cells and the data to data cells of the memory based on a predetermined distribution. The predetermined distribution includes at least one of an even distribution and a random distribution. The method also includes determining the predetermined distribution based on at least one of a size of a physical page and a size of a logical page of the memory. The memory includes multi-level flash memory.

In other features, the method includes demultiplexing the read-back pilot data and the read-back data. The method also includes estimating characteristics of pilot cells based on the read-back pilot data. The method also includes processing the read-back data based on the estimated characteristics. The method also includes estimating the characteristics through a least-mean square (LMS) operation. The method also includes compensating for variations between written data and the read-back data. The method also includes determining which of the N sequences was selected for the write to the memory.

In other features, the method includes determining which of the N sequences was selected for the write to the memory based on detection of at least one of the highest one of the signal levels repeated M times and the lowest one of the signal levels repeated M times. The signal levels include pulse-amplitude modulation (PAM) levels.

In other features, a memory system includes selector means for selecting and switching between one of N sequences of signal levels for pilot data. The N sequences are different, and N is an integer greater than 1. The system also includes multiplexer means for selectively combining data and the pilot data and for outputting a combined signal. The system also includes write means for writing to memory means for storing data based on the combined signal.

In other features, first and second of the N sequences include first and second respective subsequences. The first subsequence includes a highest one of the signal levels repeated M times, and the second subsequence includes a lowest one of the signal levels repeated M times, where M>1. The first and second of the N sequences include third and fourth respective subsequences. The third and fourth subsequences include S signal levels that are between the highest and lowest ones of the signal levels, where S÷1. The S signal levels are different and are repeated X times, where X is an integer greater than 1. The selector means selects from at least one of alternating between the N sequences and randomly selecting from the N sequences for subsequent write operations to multiple cells of the memory means.

In other features, the system includes generator means for generating the pilot data. The system also includes encoder means for encoding the data before the data is combined with the pilot data, and decoder means for decoding the data after the data is combined with the pilot data. The encoder and decoder means operate on the data according to at least one of a Reed Solomon scheme, a Bose-Chaudhuri-Hocquenghem (BCH) scheme, a Low Density Parity Check (LDPC) scheme, a Gray code scheme, and a combination of two or more of the BCH scheme, the LDPC scheme, and the Gray code scheme. The memory means includes a plurality of pages. The plurality of pages include at least one of logical and physical pages.

In other features, the system includes read means for providing read-back data and read-back pilot data from the memory means. The system also includes write means for writing the pilot data to pilot cells and the data to data cells of the memory based on a predetermined distribution. The predetermined distribution includes at least one of an even distribution and a random distribution. For the even distribution the pilot cells are spaced evenly apart in the memory means. The system further includes format means for determining the predetermined distribution based on at least one of a size of the physical pages and a size of the logical pages. The memory means includes multilevel flash memory In other features, the system includes demultiplexer means for demultiplexing the read-back pilot data and the read-back data. The system also includes estimation means for estimating characteristics of pilot cells based on the read-back pilot data. The system also includes neighbor-finder means for processing the read-back data based on the estimated characteristics. The estimation means estimates the characteristics through a least-mean square (LMS) operation. The system further includes signal processing means for compensating for variations between written data and the read-back data.

In other features, the system includes read means for determining which of the N sequences was selected for the write to the memory means. The read means determines which of the N sequences was selected for the write to the memory based on detection of at least one of the highest one of the signal levels repeated M times and the lowest one of the signal levels repeated M times. The signal levels include pulse-amplitude modulation (PAM) levels.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of memory including blocks according to the prior art;

FIG. 2A illustrates pages within the blocks of memory according to the prior art;

FIG. 2B illustrates memory cells within the pages according to the prior art;

DETAILED DESCRIPTION

Figure 2C:
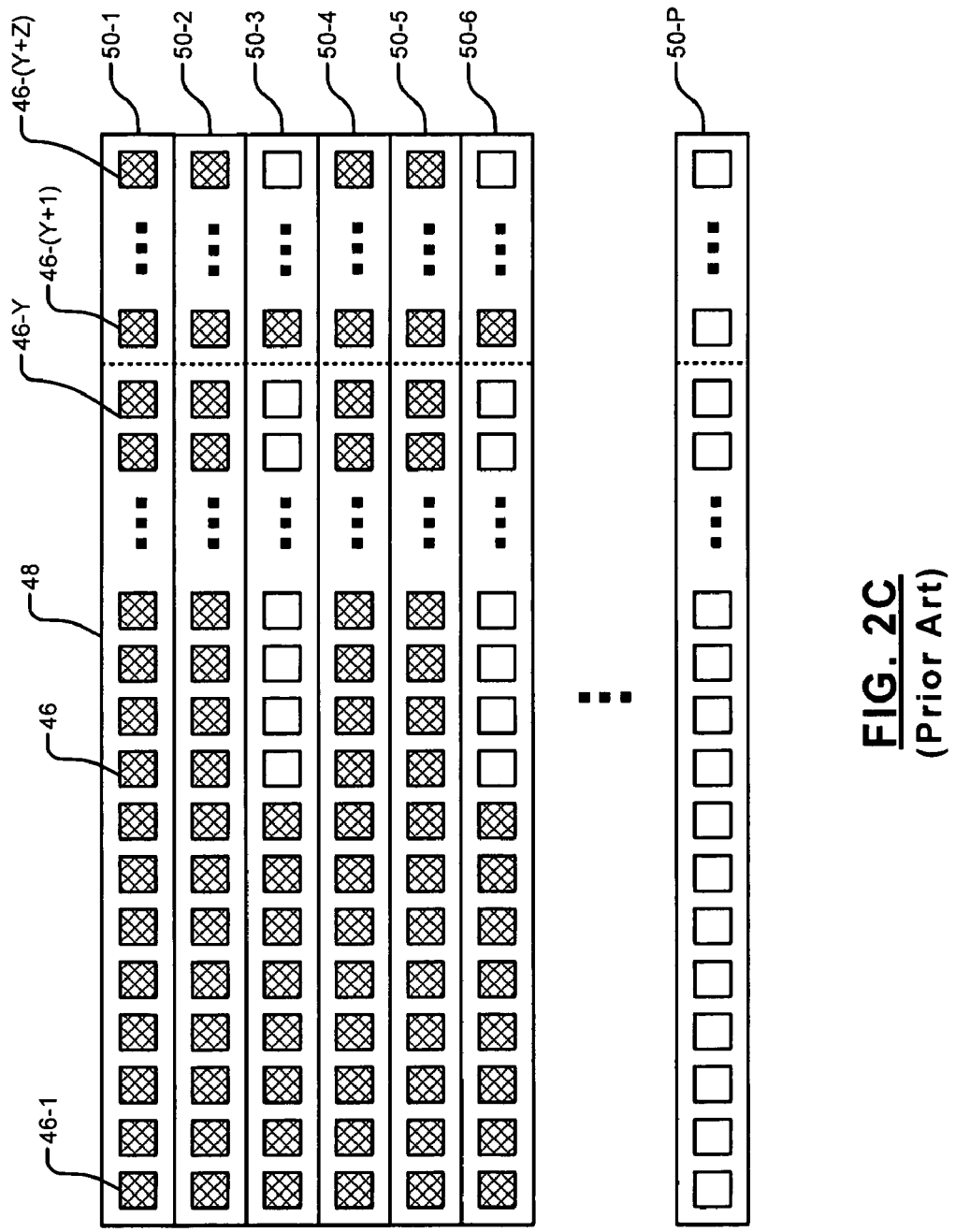
FIG. 2C illustrates memory cells arranged in a memory block according to the prior art.
Figure 2D:
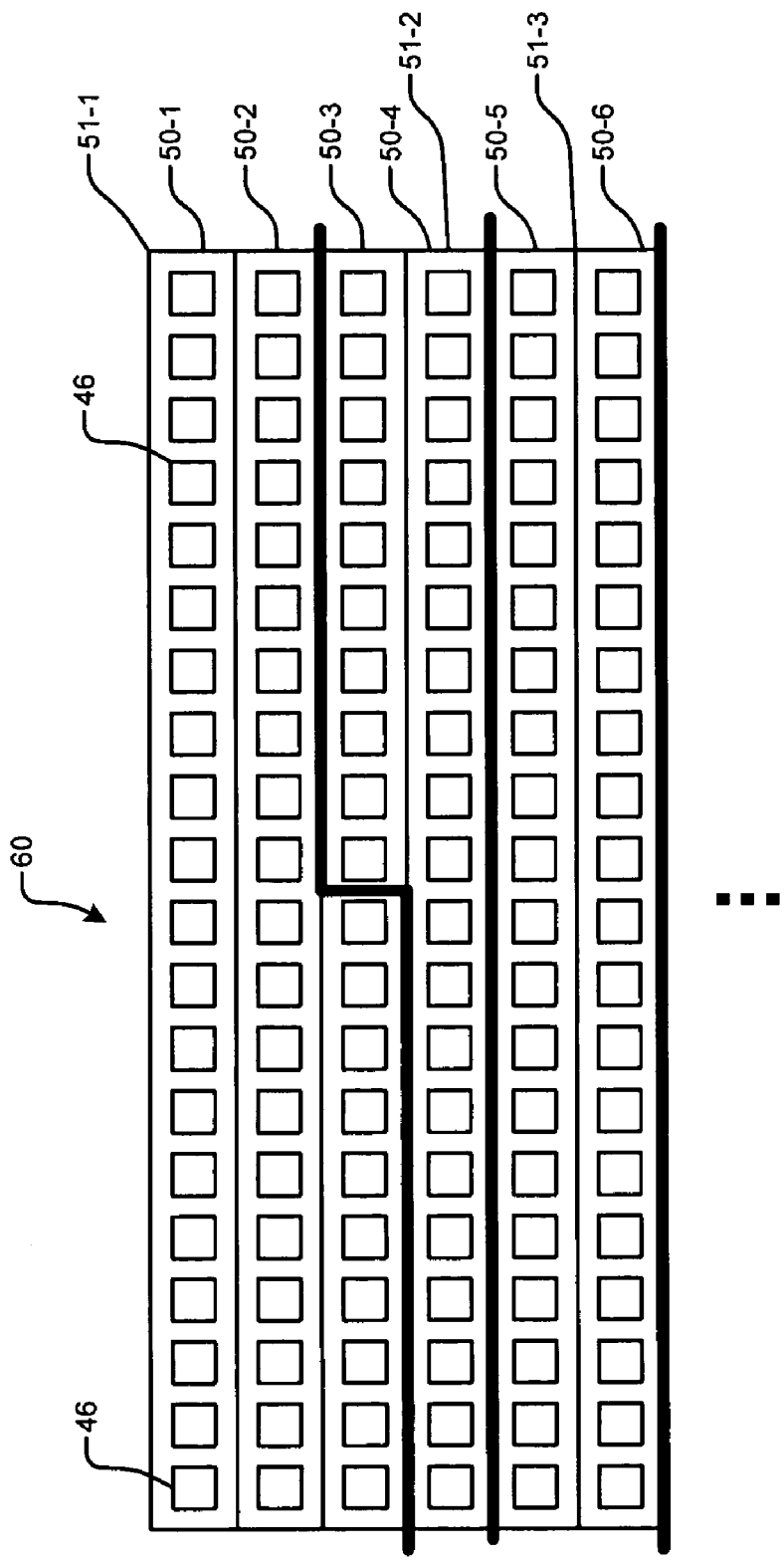
FIG. 2D illustrates memory cells arranged in a memory block according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

According to the present disclosure, a known group of memory cells in a nonvolatile memory device such as a flash memory device may be referred to as pilot cells. The use and placement of pilot cells in memory allows the pilot cells to have similar read-and-write cycling as other data cells stored in the memory. Data in pilot cells is therefore subject to similar disturbances as other data stored in the memory. The present disclosure includes a control module that determines positions for pilot cells and patterns for writing to levels within the pilot cells. The control module may minimize the number of pilot cells and may also minimize the number of levels within the pilot cells that are used.

Disturbance parameters, such as noise, vary across different logical and physical pages due to read/write cycling, manufacturing variations, and/or operating environment conditions. The control module may write pilot and user data to the memory, read-back the pilots and user data, and compare the read-back pilot data to the written pilot data. The control module may determine disturbance parameters based on the comparison.

Figure 3A:
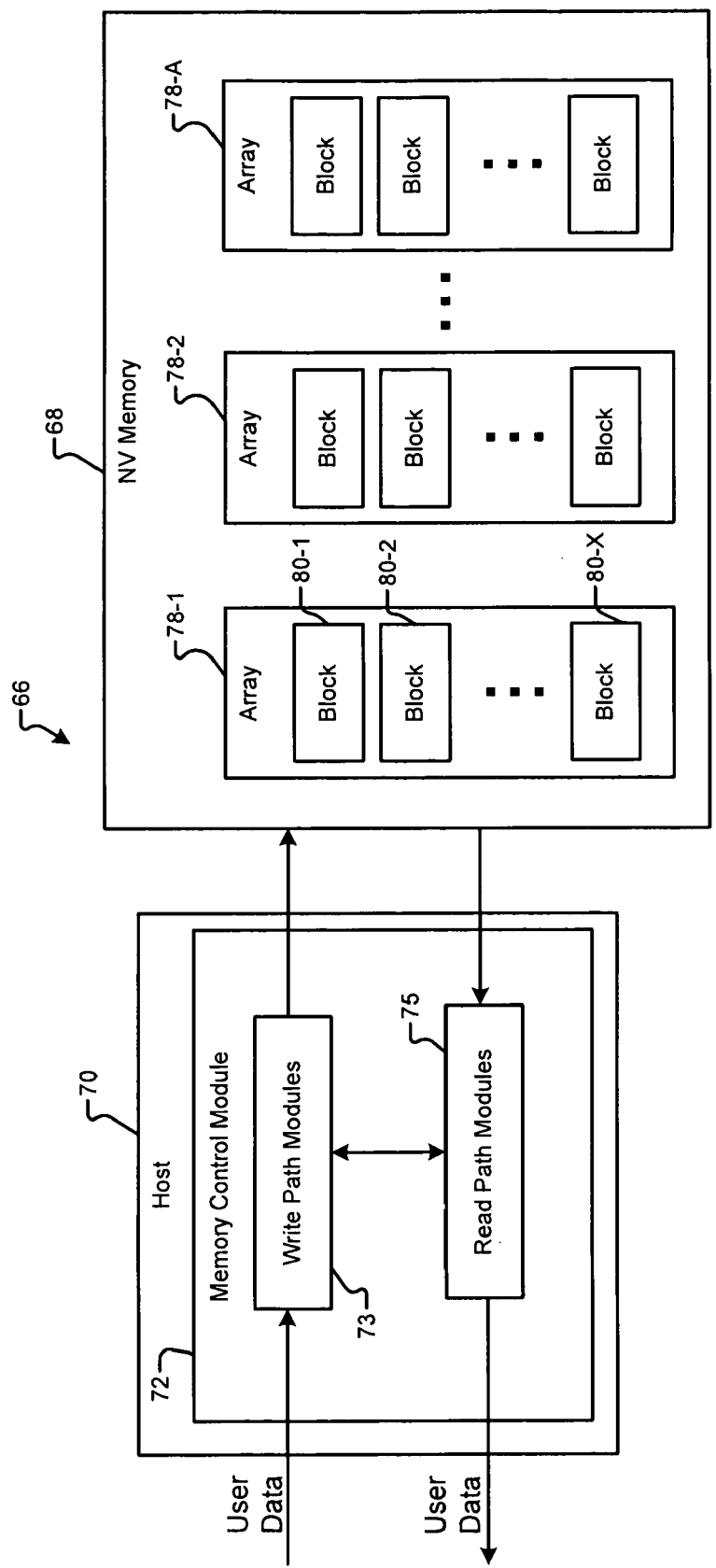
FIG. 3A is a functional block diagram of a memory system according to the present disclosure.
Figure 3B:
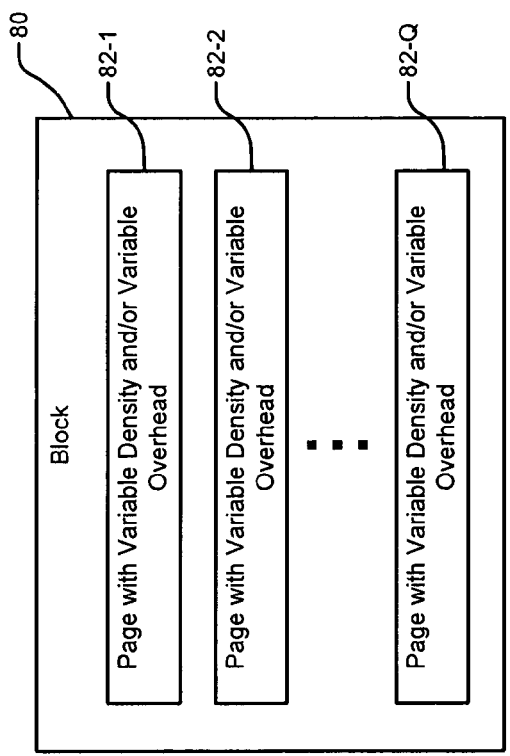
FIG. 3B illustrates a memory block including pages with variable density, page length and/or overhead.
Figure 3C:
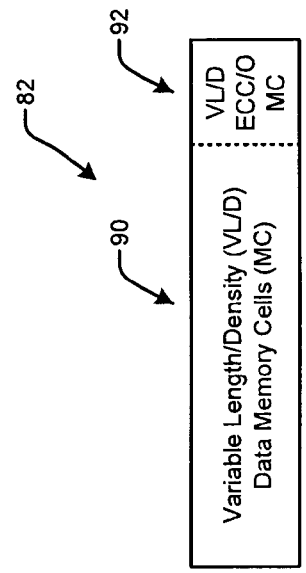
FIG. 3C illustrates a page including memory cells associated with a data portion and an overhead portion.

Referring now to FIGS. 3A-3C, a memory system 66 for non-volatile semiconductor memory 68, such as multilevel flash memory, is illustrated. In FIG. 3A, a host device 70 includes a control module 72. The control module 72 may communicate with the memory 68 via write and read path modules 73, 75.

The control module 72 may vary the number of memory cells per page in non-volatile semiconductor memory 68. The control module 72 may vary the number of memory cells allocated for the data portion and for the overhead portion for each page. The control module 72 may also determine locations for pilot cells within the non-volatile memory 68.

The non-volatile semiconductor memory 68 may include one or more arrays 78-1, 78-2, . . . , and 78-A (collectively array 78) of memory cells. The array 78 may be arranged in memory blocks 80-1, 80-2, . . . , and 80-X (collectively referred to as blocks 80). In FIG. 3B, each block 80 includes physical pages 82-1, 82-2, . . . , and 82-Q (collectively referred to as pages 82). In FIG. 3C, each page 82 includes memory cells that are associated with a data portion 90 and other memory cells that are associated with an overhead portion 92.

Memory cells of the memory 68 may store data in multiple levels. The levels may correspond to a threshold voltage distribution of the memory 68, and therefore different pulse-amplitude modulation (PAM) signaling operations may be used to write to the different levels. Alternatively, any known scheme for writing to multilevel memory may be used. For PAM signaling operations, binary data sequences may be grouped into, for instance, 2 bits per group, and each group may then be assigned to a threshold voltage level. The control module may program the memory cells according to the assigned threshold voltage levels.

For example, a 4 level cell may store 2 bits/cell. The 4 levels may therefore correspond to logical states 00, 01, 10, 11, where each logical state has at least one corresponding voltage threshold. 4PAM signaling may therefore be used to write to the 4 levels at the corresponding voltage thresholds. Further, an 8 level cell may include 3 bits/cell that correspond to logical states 000, 001, . . . , and 111. 8PAM signaling may write to the 8 different levels. Further information relating to writing to multiple memory levels may be found in United States Patent Publication Number 20070171714 entitled Flash Memory With Coding and Signal Processing, which is incorporated herein by reference in its entirety.

Figure 4:
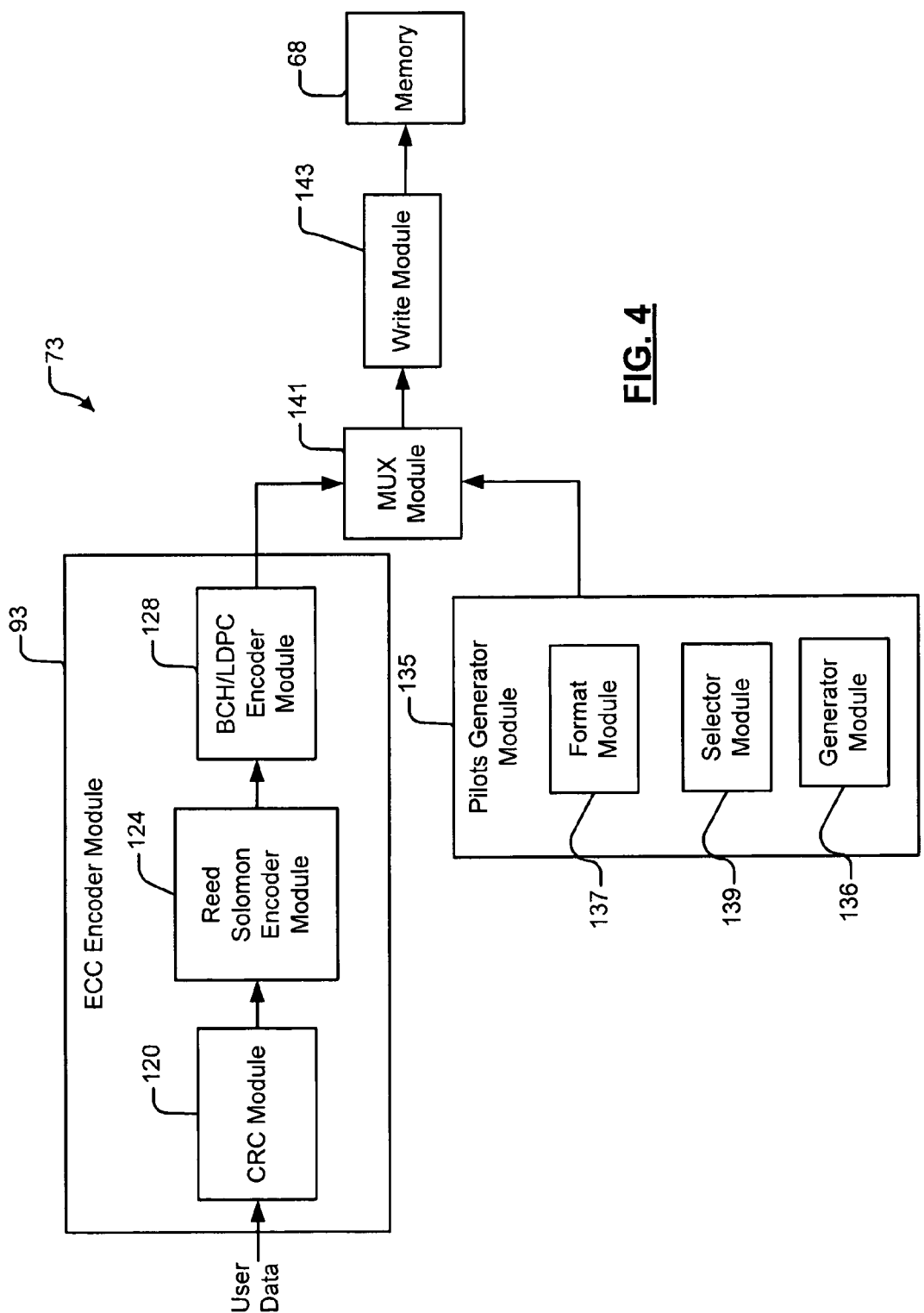
FIG. 4 is a functional block diagram of a write path module according to the present disclosure.

Referring now to FIG. 4, the write path module 73 is illustrated. The write path module 73 may include an error correcting code (ECC) encoder module 93 that encodes an overhead portion of the memory 68. The ECC encoder module 93 may include a cyclic redundancy (CRC) module 120 that generates CRC bits based on user data. The ECC encoder module 93 may include other encoding modules. For example, a Reed Solomon encoder module 124 of the ECC encoder module 93 may perform Reed Solomon encoding based on CRC module signals. A Bose-Chaudhuri-Hocquenghem (BCH)/Low Density Parity Check (LDPC) encoder module 128 of the ECC encoder module 93 may perform either BCH or LDPC encoding based on Reed Solomon encoder module signals. Various other encoding modules may also be used.

A pilot generator module 135 of the write path module 73 may include a generator module 136 that selectively generates pilot data, as will be described below. The pilot data generator module 135 may also include a format module 137 that may set cell locations in the memory 68 for the pilot data. The format module 137 may set locations for pilot data at a start, middle, and/or end of a physical page and/or a logical page. The format module 137 may also set locations for pilot data according to a known pattern. The pilot data generator module 135 may also include a selector module 139 that selects one of a plurality of sequences of PAM levels for writing to pilot cells. The selector module may randomly select a sequence or may alternate between sequences.

A multiplexer module 141 receives and selectively combines the encoded user data from the ECC encoder module 93 and the pilot data. The combination may be based on the aforementioned sequences and PAM operations. The multiplexer module 141 selectively outputs the combined pilot and user data in a data stream to a write module 143 that writes to the memory 68.

For example only, during write operations, the selector module 139 may select from two or more sequences for a first write operation. The two sequences may be referred to as sequence A and sequence B. The sequences may have predefined lengths or alternatively may have lengths that are based on the number of pilot cells that will be written to for a particular page or block of the memory 68. The selector module 139 alternates between sequences A and B in subsequent write operations. Write operations may include writing to one or more cells of the memory 68.

In other words, for a first write operation, sequence A may be selected to write multiple cells of the memory 68. For a second write operation, sequence B may be selected to write to multiple cells (that may or may not be the same cells as those written to using sequence A). The selector module 138 may make subsequent selections of sequences based on complete or partial write operations to groups of memory cells. The selector module 138 need not complete sequence A before selecting sequence B.

The multiplexer module 141 combines pilot data and user data (encoded data stream) to be written to the memory 68. The combination may be based on the selected sequence and may fix positions of the pilot data for each logical page.

In flash memory, different cell levels may have correspondingly different voltage characteristics. The first and last cell levels may have substantially different voltage characteristics, whereas intermediate levels may have relatively similar voltage characteristics. For example, an 8 level cell may include levels 0-7. The lowest level (level 0) and highest level (level 7) may have unique characteristics while levels 1-6 may have similar characteristics.

The selector module 139 may select sequences that instruct write operations to write to as few levels as possible. The selector module 139 may therefore select a sequences that includes writing to level 0 and level 7 and two of the intermediate levels (for example levels 2 and 5). The read path module 75 may interpolate voltage characteristics of the unselected levels (levels 1, 3, 4, 6) based on levels 2 and 5 because levels 1-6 have similar voltage characteristics. The selector module sequences may therefore select 4 levels that may provide write/read-back characteristics of an entire cell or group of cells regardless of the number of possible levels. However, the present disclosure is not limited to 4 levels, and any or all levels may be used.

The following paragraph indicates 4 exemplary levels used for 8PAM signaling, 12PAM signaling, and 16PAM signaling (non-normalized) signaling. For 8PAM, the selector module 139 selects a sequence that includes signal levels 0, 1, 4, and 7. For 12PAM, the selector module 139 selects a sequence that includes signal levels 0, 1, 6 and 11. For 16PAM, the selector module 139 selects a sequence that includes signal levels 0, 1, 8 and 15. For 32PAM, the selector module 139 selects a sequence that includes pilot levels 0, 1, 16 and 31.

The selector module 139 may select from exemplary sequences A and B. The read path 75 may determine whether sequence A or B is used based on the levels of the first 3 pilot cells that are detected that are written to.

For sequence A, level 0 is written to for the first 3 pilot cells, while for Scheme B, the highest level may be written for the first 3 pilot cells. The highest level may be 7 for 8PAM, 11 for 12PAM and 15 for 16PAM, respectively. Subsequent pilot levels of sequence A are used in a cyclical pattern that includes the four levels selected. Subsequent pilot levels of sequence B may be a cyclical shift of the pilot levels of sequence A. For example, for 8PAM signaling, sequence A: 0 0 0 1 4 7 0 1 4 7 0 1 4 7 . . . , and sequence B: 7 7 7 4 1 0 7 4 1 0 7 4 1 0 . . . . Sequences A and B are not required to be cyclically shifted but may merely differ in other ways. Sequences A and B are selected so that the read module can easily distinguish between them. In the above example, the read module may do a majority of the decoding on the first three cells to decide whether the pilot sequence A or B is used. Therefore, the write module does not need to explicitly tell the read module which sequence is used.

The format module 137 may set locations for the pilot data that do not depend on the PAM for the memory cells. Alternatively, the multiplexer module 141 may insert pilot data into user data as a function of the PAM of the memory cells. For example, there may be 512 cells in for pilot data per sector of size 33 KB. Thus, for each physical page of 2 KB+64B, 32 cells are allocated for pilot data. In the following, the frequency of pilot cells appearing in the flash memory device is computed for 8PAM, 12PAM, 16PAM and 32PAM.

For 8PAM signaling, there may be 5632 cells per physical page. Therefore, every 176 cells may contain one pilot cell. Every 176*3=528 bits may contain 3 pilot bits. For 12PAM signaling, there may be 2414 cell-pairs/physical page. Therefore, every 150 cell-pairs may contain one pair of pilot cells. Every 150*7=1050 bits may contain 7 pilot bits. For 16PAM signaling, there may be 4224 cells per page. Every 132 cells may contain one pilot cell. Every 132*4=528 bits may therefore contain 4 pilot bits. For 32PAM signaling, there may be 3380 cells per page. Every 105 cells may contain one pilot cell. Every 105*5=605 bits may therefore contain 5 pilot bits.

Figure 5:
FIG. 5 illustrates pilot cell positions for 8 pulse-amplitude modulation (PAM)

Referring now to FIG. 5, for 8PAM signaling, the levels the pilot data is written to are listed above. More than one sequence may be used to simulate deterioration of memory cells. The sequences, when implemented by the write module 143, may include writing to the same level in a number (for example the first three) of pilot cells so that the read path module 75 may recognize which pattern is being used. Based on sequence A, the write module 143 writes to the highest levels of the first 3 cells of sequence A, whereas the write module 143 writes to the lowest levels of the first 3 cells of sequence B. The placement of pilot cells corresponding to 8PAM is depicted in FIG. 5. In FIG. 5, solid cells denote pilot cells, while the blank cells represent data cells. There are 175 data cells between pilot cells.

Figure 6:
FIG. 6 illustrates pilot cell positions for 12PAM pilots.

Referring now to FIG. 6, for 12PAM, the situation is slightly different, for example, 2 cells store 7 bits total. Hence, the pilot cells (for example, pilot cells 200, 201) appear in pairs, in contrast to the 8PAM case. Exemplary 12PAM sequences include: sequence A: 0 0 0 1 6 1 1 0 1 6 1 1 0 1 6 1 1 . . . and sequence B: 1 1 1 1 1 1 6 1 0 1 1 6 1 0 1 1 6 1 0 . . . . The placement of 12PAM pilot data for sequences A and B are illustrated in FIG. 6. Similar notations as in FIG. 5 are used.

Figure 7:
FIG. 7 illustrates pilot cell positions for 16PAM pilots.

Referring now to FIG. 7, for 16PAM pilot signal levels and their placement are similar to 8PAM, except that the number of data cells between pilot cells is different. Exemplary 16PAM sequence include: sequence A: 0 0 0 1 8 1 5 0 1 8 1 5 0 1 8 1 5 . . . and sequence B: 1 5 1 5 1 5 8 1 0 1 5 8 1 0 1 5 8 1 0 . . . . The pilot cell placement is depicted in FIG. 7. The pilot cell placement for 32PAM is similar to 8PAM and 16PAM.

A logical page size after encoding varies for different code configurations. Here, a logical page is referring to a block of 2 KB user data along with ECC parity data. To simplify the control logic, the format module 137 may arrange pilot cells in fixed locations relative to the logical page. Increasing the number of locations for pilot data may increase the accuracy of disturbance determinations based on pilot signal processing. Further, all logical pages may include locations for pilot data. All logical and/or all physical pages may include a same number of locations for pilot data. The locations may be the same relative to start and end-points of the pages.

Figure 8:
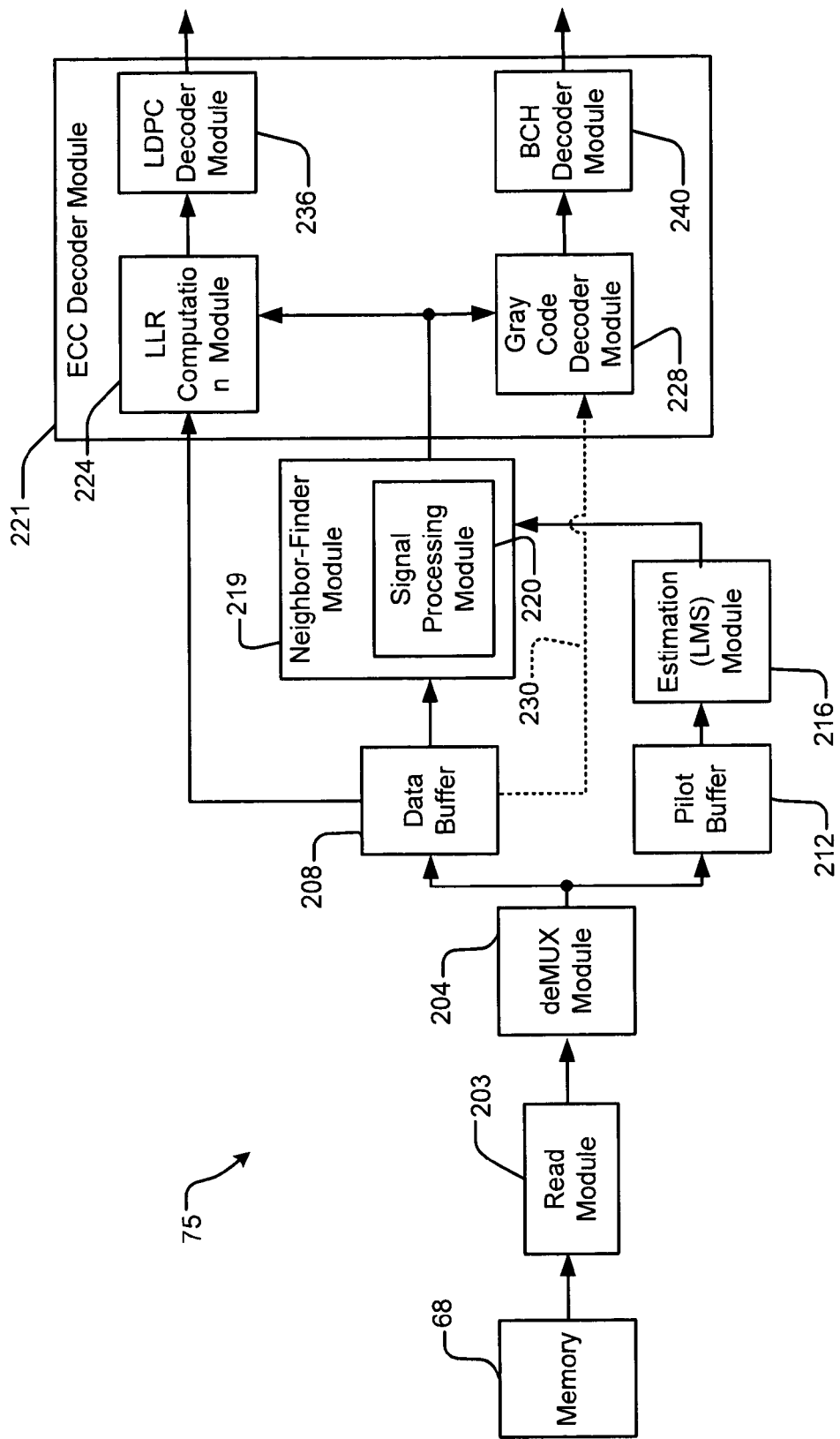
FIG. 8 is a functional block diagram of a read path module according to the present disclosure.

Referring now to FIG. 8, a read path module 75 is illustrated. The read path module 75 includes a read module 203 that reads user data and pilot data, which also may be referred to as pilot signals, from the memory 68. A demultiplexer module 204 receives and demultiplexes the user data and pilot signals. A data buffer 208 receives the user data, and a pilot buffer 212 receives the pilot signals. An estimation module 216 receives an output of the pilot buffer 212 and may perform a least means squared (LMS) operation on the pilot data. The estimation module 216 estimates voltage distribution parameters for pilot cells based on the levels that were written to for each cell. A neighbor-finder module 219 that may include a signal processing module 220 receives outputs of the estimation module 216 and the data buffer 208. The functionality of the neighbor-finder module 219 is to find the signal level(s) that are closest to the received signal sample. The neighbor finder output is then passed to ECC decoder module.

An ECC decoder module 221 decodes the read-back signals that were partially encoded by the ECC encoder module 93. The ECC decoder module 221 may include a log-likelihood ratio (LLR) computation module 224, a LDPC module 236, a Gray Code decoder module 228, and a BCH decoder module 240. The LLR computation module 224 receives an output of the data buffer 208 and an output of the neighbor-finder module 219. An output of the data buffer 208 may also be fed directly to the Gray code decoder module 228 via a bypass 230 when the memory module directly outputs binary data. A LDPC decoder module 236 may receive LLR output data from the LLR computation module 224. A BCH decoder 240 may receive binary outputs from the Gray code decoder module 228. Finally, the output of LDPC decoder or BCH decoder may further be decoded by a Reed-Solomon decoder (not shown) and subsequently checked by a CRC decoder (not shown).

The write and read modules 143, 203 may employ column and row select modules (not shown) to select memory cells within the memory 68. During a write operation, the write module 143 selects write target cells. The write target cells may include any number of memory cells, such as a particular cell, a row of cells, a column of cells, a block of cells, a page of cells, etc., and pilot data associated with the cells. Once the write target cells are selected, the write module 143 generates a write signal.

During a read operation, the read module 203 selects read target cells, which may include any number of memory cells, such as a particular cell, a row of cells, a column of cells, a block of cells, a page of cells, etc. Once the read target cells are selected, the read module 203 reads the read target cells.

The read path module 75 may read back data from the memory 68 in analog or binary form as an analog or binary signal. If the signal is binary, the demultiplexer module 204 demultiplexes the pilot bits from the input user data, and the user data is directly sent to the Gray code decoder module 228 via the bypass 230. When the signal is analog, the user data and pilot data are processed with adaptive signal processing algorithms as will be described further below.

When the signal is analog, the demultiplexer module 204 separates the pilot data signal from the user data signal and stores them in the pilot buffer 212 and the data buffer 208, respectively. The estimation module 216 estimates mean and standard deviations of threshold distributions of the levels based on the pilot data. The neighbor-finder module 219 processes the user data in the data buffer 208 using the updated parameters from the estimation module 216. The received user data and/or pilot data may be received in signals that have corresponding signal constellation features based on a PAM signaling operation. The neighbor-finder module 219 finds signal constellation points that are close to the received signal point (in normalized Euclidean distance sense).

If data are LDPC coded, the output from the neighbor-finder module 219 in combination with the original user data are used by the LLR computation module 224 to calculate log-likelihood ratios. Otherwise, the Gray code decoder module 228 translates the output from the neighbor-finder module 219 into coded binary bits for the BCH decoder 240.

The estimation module 216 may determine statistical parameters for disturbances of memory cells. The write path module 73 writes pilot data to the locations, and the estimation module 216 reads the data back and compares the read-back data to the pilot data. Disturbance characteristics may vary for each physical block of the memory 68. The estimation module 216 may determine parameters for disturbances based on differences of expected to actual pilot signals. The estimation module 216 may include an algorithm, such as the least-mean-squares (LMS) algorithm that determines the parameters and may adapt the algorithm for subsequent read/write operations.

Figure 9:
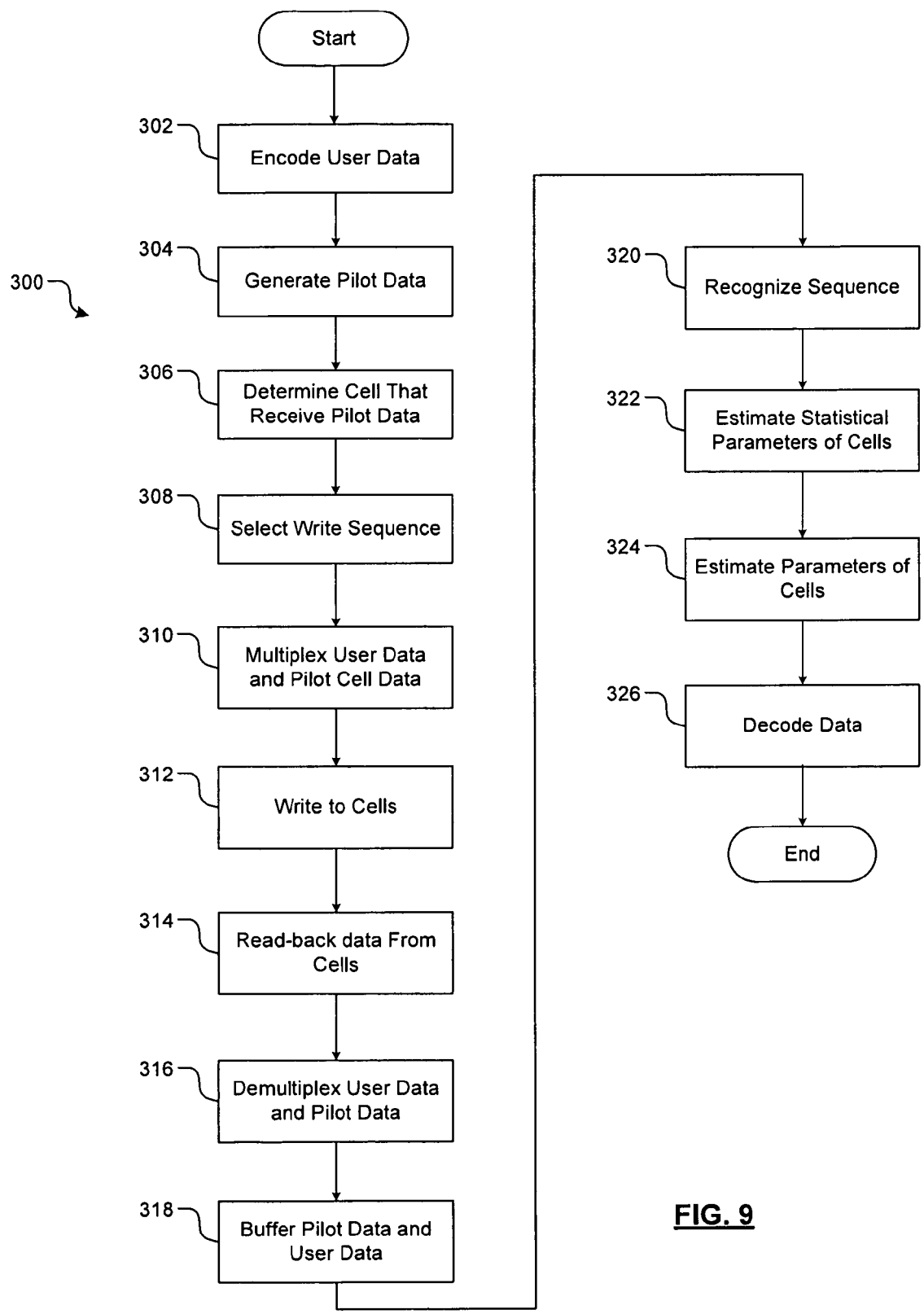
FIG. 9 illustrates a method for operating the memory system according to the present disclosure.

Referring now to FIG. 9, an exemplary flowchart 300 illustrates the operation of the system. Logic starts in step 302 when an encoder 93 encodes user data that is to be stored in memory 68. In step 304, the pilots generator module 135 generates pilot data. In step 306, the pilots generator module 135 determines which cells in the memory 68 will receive the pilot data. In step 308, the pilots generator module 135 selects a write sequence for the pilot data. The pilots generator module 135 may variably select between two or more sequences. For example, the pilots generator module 135 may randomly select from two or more sequences or may selectively alternate between two or more sequences.

In step 310, a multiplexer module 141 multiplexes the user data and pilot data. In step 312, a write module 143 writes to the memory 68 based on the multiplexed data. In step 314, a read module 203 reads data back from the memory 68. In step 316, a demultiplexer module 204 demultiplexes user data from pilot data. In step 318, user data and pilot data are buffered separately. In step 320, an estimation module 216 recognizes the selected sequence and estimates parameters of the pilot cells in step 322 based on the sequence and disturbances that the pilot cells experienced. In step 324, a signal processing module 220 estimates the data stored for cells in memory. In step 326, a decoder module 221 decodes the data.

Referring now to FIGS. 10A-10G, various exemplary implementations incorporating the teachings of the present disclosure are shown.

Figure 10A:
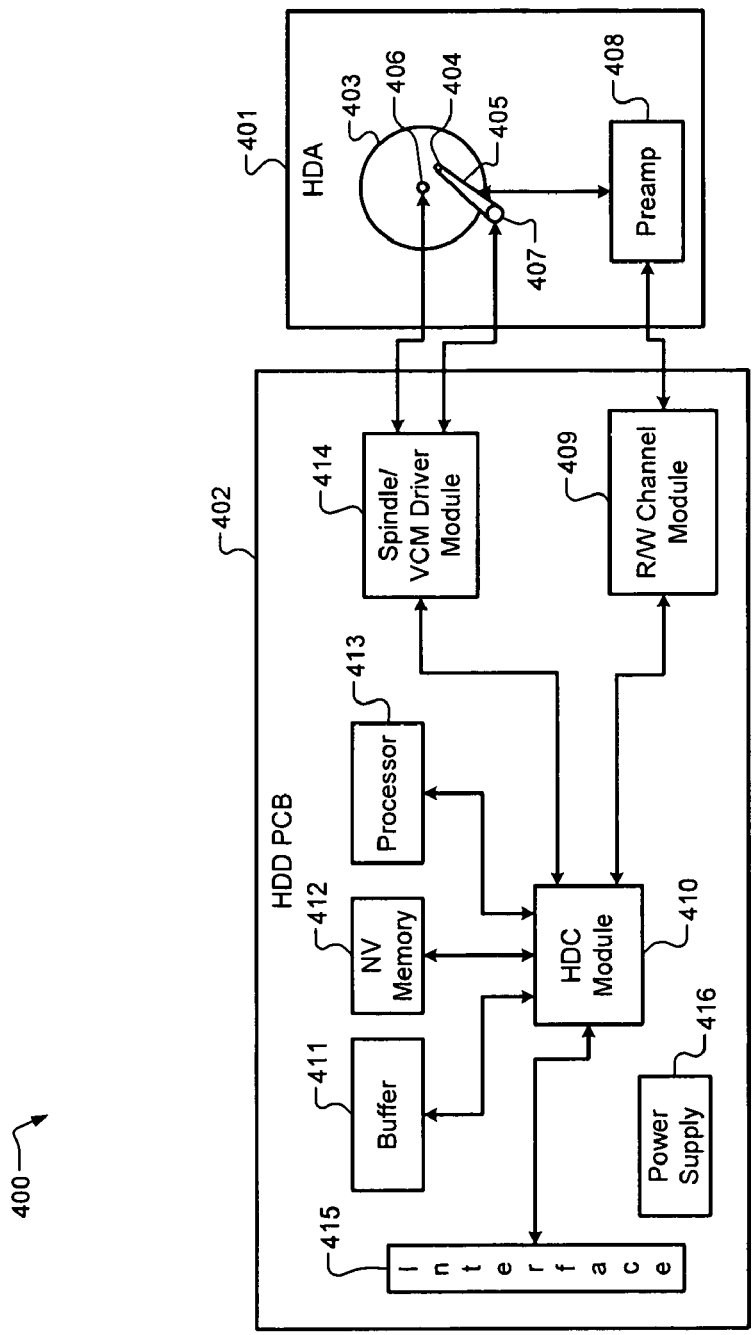
FIG. 10A is a functional block diagram of a hard disk drive.

Referring now to FIG. 10A, the teachings of the disclosure can be implemented to write and read back pilots to nonvolatile memory 412 of a hard disk drive (HDD) 400. The HDD 400 includes a hard disk assembly (HDA) 401 and an HDD printed circuit board (PCB) 402. The HDA 401 may include a magnetic medium 403, such as one or more platters that store data, and a read/write device 404. The read/write device 404 may be arranged on an actuator arm 405 and may read and write data on the magnetic medium 403. Additionally, the HDA 401 includes a spindle motor 406 that rotates the magnetic medium 403 and a voice-coil motor (VCM) 407 that actuates the actuator arm 405. A preamplifier device 408 amplifies signals generated by the read/write device 404 during read operations and provides signals to the read/write device 404 during write operations.

The HDD PCB 402 includes a read/write channel module (hereinafter, "read channel") 409, a hard disk controller (HDC) module 410, a buffer 411, the nonvolatile memory 412, a processor 413, and a spindle/VCM driver module 414. The read channel 409 processes data received from and transmitted to the preamplifier device 408. The HDC module 410 controls components of the HDA 401 and communicates with an external device (not shown) via an I/O interface 415. The external device may include a computer, a multimedia device, a mobile computing device, etc. The I/O interface 415 may include wireline and/or wireless communication links.

The HDC module 410 may receive data from the HDA 401, the read channel 409, the buffer 411, nonvolatile memory 412, the processor 413, the spindle/VCM driver module 414, and/or the I/O interface 415. The processor 413 may process the data, including encoding, decoding, filtering, and/or formatting. The processed data may be output to the HDA 401, the read channel 409, the buffer 411, nonvolatile memory 412, the processor 413, the spindle/VCM driver module 414, and/or the I/O interface 415.

The HDC module 410 may use the buffer 411 and/or nonvolatile memory 412 to store data related to the control and operation of the HDD 400. The buffer 411 may include DRAM, SDRAM, etc. Nonvolatile memory 412 may include any suitable type of semiconductor or solid-state memory, such as flash memory (including NAND and NOR flash memory), phase change memory, magnetic RAM, and multi-state memory, in which each memory cell has more than two states. The spindle/VCM driver module 414 controls the spindle motor 406 and the VCM 407. The HDD PCB 402 includes a power supply 416 that provides power to the components of the HDD 400.

Figure 10B:
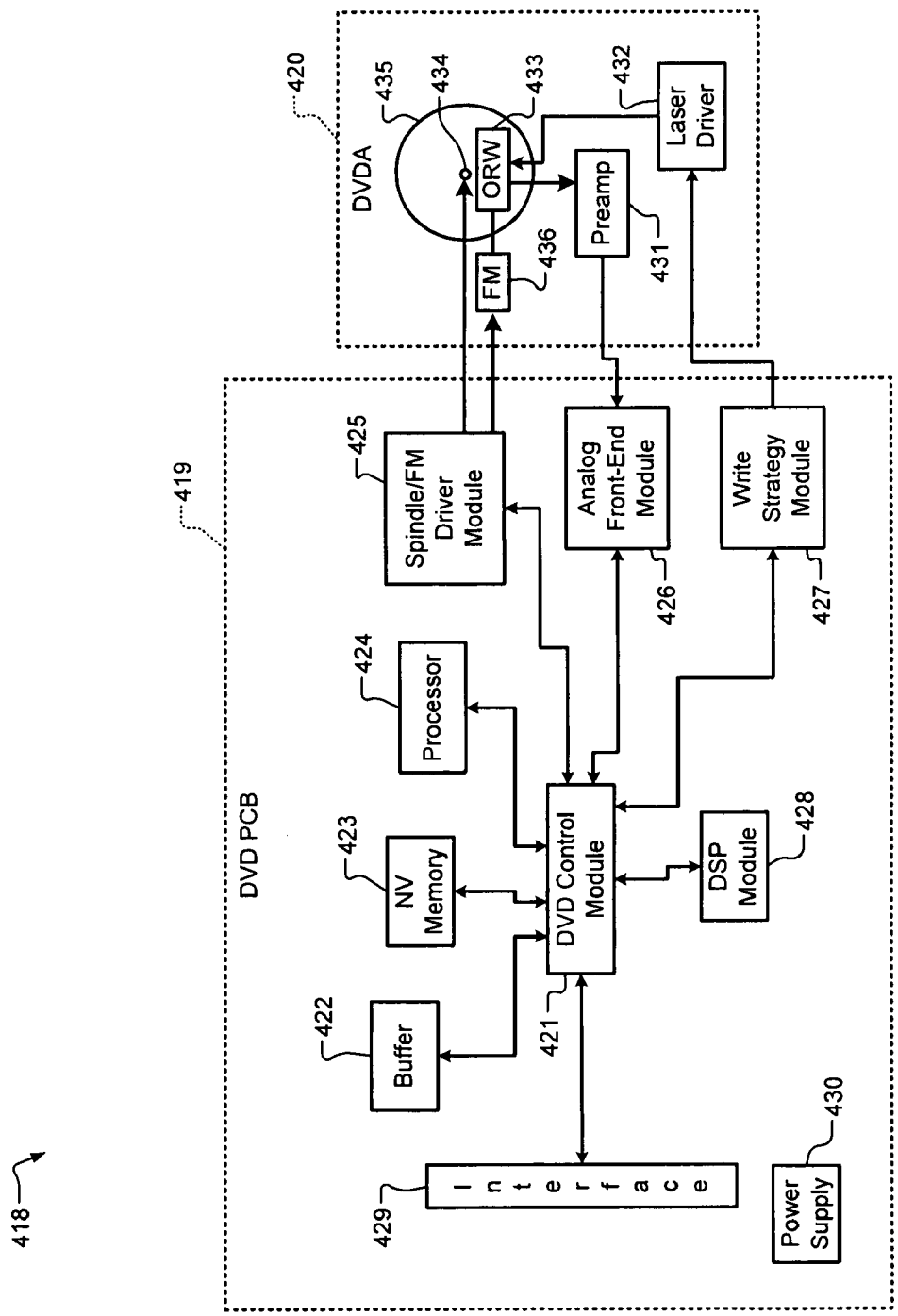
FIG. 10B is a functional block diagram of a DVD drive.

Referring now to FIG. 10B, the teachings of the disclosure can be implemented to write and read back pilots to nonvolatile memory 423 of a DVD drive 418 or of a CD drive (not shown). The DVD drive 418 includes a DVD PCB 419 and a DVD assembly (DVDA) 420. The DVD PCB 419 includes a DVD control module 421, a buffer 422, the nonvolatile memory 423, a processor 424, a spindle/FM (feed motor) driver module 425, an analog front-end module 426, a write strategy module 427, and a DSP module 428.

The DVD control module 421 controls components of the DVDA 420 and communicates with an external device (not shown) via an I/O interface 429. The external device may include a computer, a multimedia device, a mobile computing device, etc. The I/O interface 429 may include wireline and/or wireless communication links.

The DVD control module 421 may receive data from the buffer 422, nonvolatile memory 423, the processor 424, the spindle/FM driver module 425, the analog front-end module 426, the write strategy module 427, the DSP module 428, and/or the I/O interface 429. The processor 424 may process the data, including encoding, decoding, filtering, and/or formatting. The DSP module 428 performs signal processing, such as video and/or audio coding/decoding. The processed data may be output to the buffer 422, nonvolatile memory 423, the processor 424, the spindle/FM driver module 425, the analog front-end module 426, the write strategy module 427, the DSP module 428, and/or the I/O interface 429.

The DVD control module 421 may use the buffer 422 and/or nonvolatile memory 423 to store data related to the control and operation of the DVD drive 418. The buffer 422 may include DRAM, SDRAM, etc. Nonvolatile memory 423 may include any suitable type of semiconductor or solid-state memory, such as flash memory (including NAND and NOR flash memory), phase change memory, magnetic RAM, and multi-state memory, in which each memory cell has more than two states. The DVD PCB 419 includes a power supply 430 that provides power to the components of the DVD drive 418.

The DVDA 420 may include a preamplifier device 431, a laser driver 432, and an optical device 433, which may be an optical read/write (ORW) device or an optical read-only (OR) device. A spindle motor 434 rotates an optical storage medium 435, and a feed motor 436 actuates the optical device 433 relative to the optical storage medium 435.

When reading data from the optical storage medium 435, the laser driver provides a read power to the optical device 433. The optical device 433 detects data from the optical storage medium 435, and transmits the data to the preamplifier device 431. The analog front-end module 426 receives data from the preamplifier device 431 and performs such functions as filtering and A/D conversion. To write to the optical storage medium 435, the write strategy module 427 transmits power level and timing data to the laser driver 432. The laser driver 432 controls the optical device 433 to write data to the optical storage medium 435.

Figure 10D:
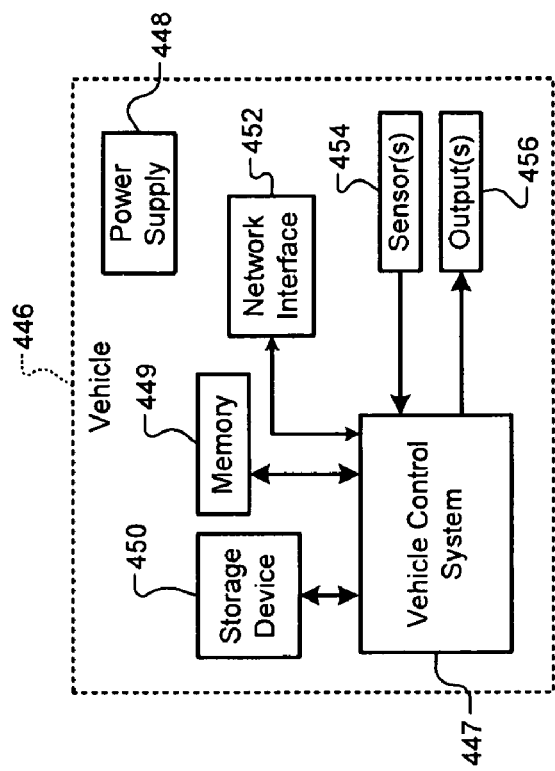
FIG. 10D is a functional block diagram of a vehicle control system.
Figure 10C:
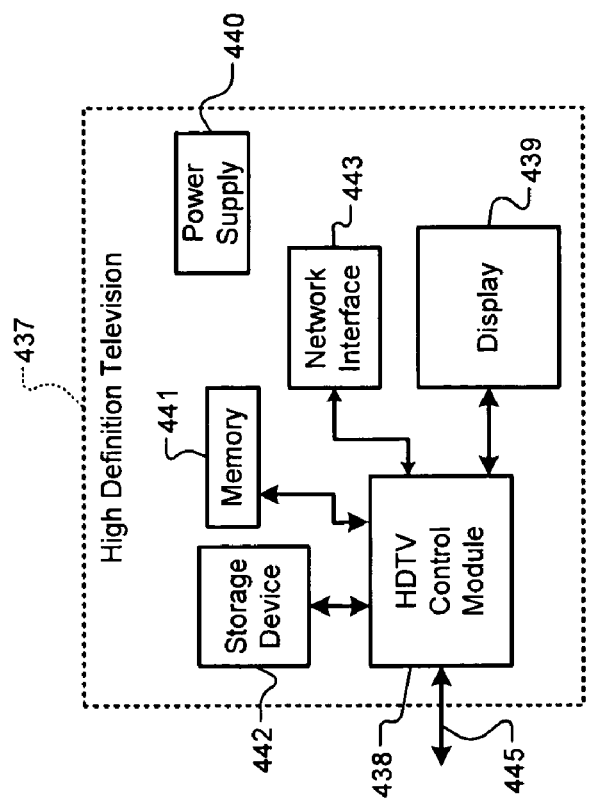
FIG. 10C is a functional block diagram of a high definition television.

Referring now to FIG. 10C, the teachings of the disclosure can be implemented to write and read back pilots to memory 441 of a high definition television (HDTV) 437. The HDTV 437 includes an HDTV control module 438, a display 439, a power supply 440, the memory 441, a storage device 442, a network interface 443, and an external interface 445. If the network interface 443 includes a wireless local area network interface, an antenna (not shown) may be included.

The HDTV 437 can receive input signals from the network interface 443 and/or the external interface 445, which can send and receive data via cable, broadband Internet, and/or satellite. The HDTV control module 438 may process the input signals, including encoding, decoding, filtering, and/or formatting, and generate output signals. The output signals may be communicated to one or more of the display 439, memory 441, the storage device 442, the network interface 443, and the external interface 445.

Memory 441 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 442 may include an optical storage drive, such as a DVD drive, and/or a hard disk drive (HDD). The HDTV control module 438 communicates externally via the network interface 443 and/or the external interface 445. The power supply 440 provides power to the components of the HDTV 437.

Referring now to FIG. 10D, the teachings of the disclosure may be implemented to write and read back pilots to memory 449 of a vehicle 446. The vehicle 446 may include a vehicle control system 447, a power supply 448, the memory 449, a storage device 450, and a network interface 452. If the network interface 452 includes a wireless local area network interface, an antenna (not shown) may be included. The vehicle control system 447 may be a powertrain control system, a body control system, an entertainment control system, an anti-lock braking system (ABS), a navigation system, a telematics system, a lane departure system, an adaptive cruise control system, etc.

The vehicle control system 447 may communicate with one or more sensors 454 and generate one or more output signals 456. The sensors 454 may include temperature sensors, acceleration sensors, pressure sensors, rotational sensors, airflow sensors, etc. The output signals 456 may control engine operating parameters, transmission operating parameters, suspension parameters, etc.

The power supply 448 provides power to the components of the vehicle 446. The vehicle control system 447 may store data in memory 449 and/or the storage device 450. Memory 449 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 450 may include an optical storage drive, such as a DVD drive, and/or a hard disk drive (HDD). The vehicle control system 447 may communicate externally using the network interface 452.

Figure 10F:
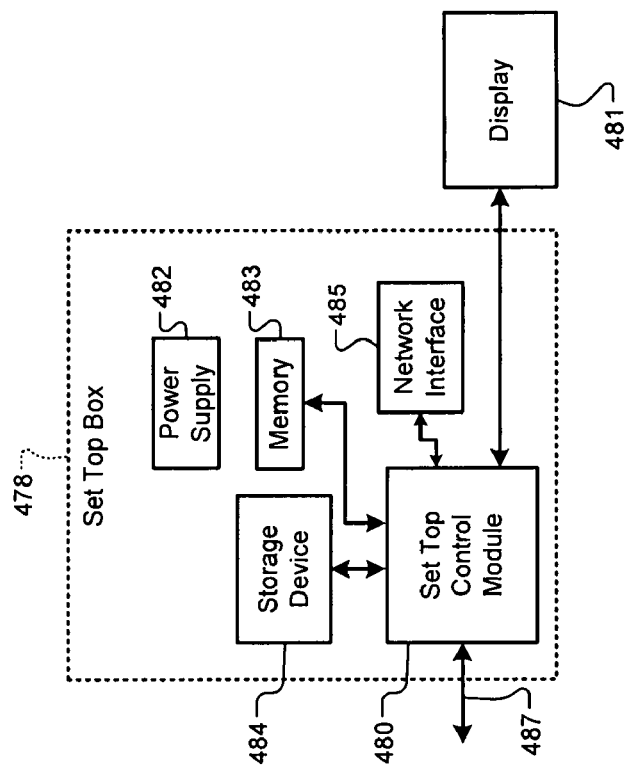
FIG. 10F is a functional block diagram of a set top box.
Figure 10E:
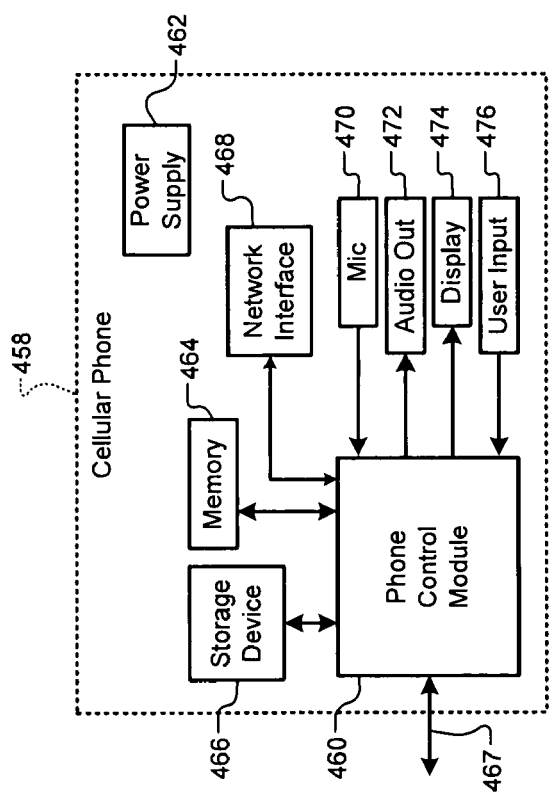
FIG. 10E is a functional block diagram of a cellular phone.

Referring now to FIG. 10E, the teachings of the disclosure can be implemented to write and read back pilots to memory 464 of a cellular phone 458. The cellular phone 458 includes a phone control module 460, a power supply 462, the memory 464, a storage device 466, and a cellular network interface 467. The cellular phone 458 may include a network interface 468, a microphone 470, an audio output 472 such as a speaker and/or output jack, a display 474, and a user input device 476 such as a keypad and/or pointing device. If the network interface 468 includes a wireless local area network interface, an antenna (not shown) may be included.

The phone control module 460 may receive input signals from the cellular network interface 467, the network interface 468, the microphone 470, and/or the user input device 476. The phone control module 460 may process signals, including encoding, decoding, filtering, and/or formatting, and generate output signals. The output signals may be communicated to one or more of memory 464, the storage device 466, the cellular network interface 467, the network interface 468, and the audio output 472.

Memory 464 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 466 may include an optical storage drive, such as a DVD drive, and/or a hard disk drive (HDD). The power supply 462 provides power to the components of the cellular phone 458.

Referring now to FIG. 10F, the teachings of the disclosure can be implemented to write and read back pilots to memory 483 of a set top box 478. The set top box 478 includes a set top control module 480, a display 481, a power supply 482, the memory 483, a storage device 484, and a network interface 485. If the network interface 485 includes a wireless local area network interface, an antenna (not shown) may be included.

The set top control module 480 may receive input signals from the network interface 485 and an external interface 487, which can send and receive data via cable, broadband Internet, and/or satellite. The set top control module 480 may process signals, including encoding, decoding, filtering, and/or formatting, and generate output signals. The output signals may include audio and/or video signals in standard and/or high definition formats. The output signals may be communicated to the network interface 485 and/or to the display 481. The display 481 may include a television, a projector, and/or a monitor.

The power supply 482 provides power to the components of the set top box 478. Memory 483 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 484 may include an optical storage drive, such as a DVD drive, and/or a hard disk drive (HDD).

Figure 10G:
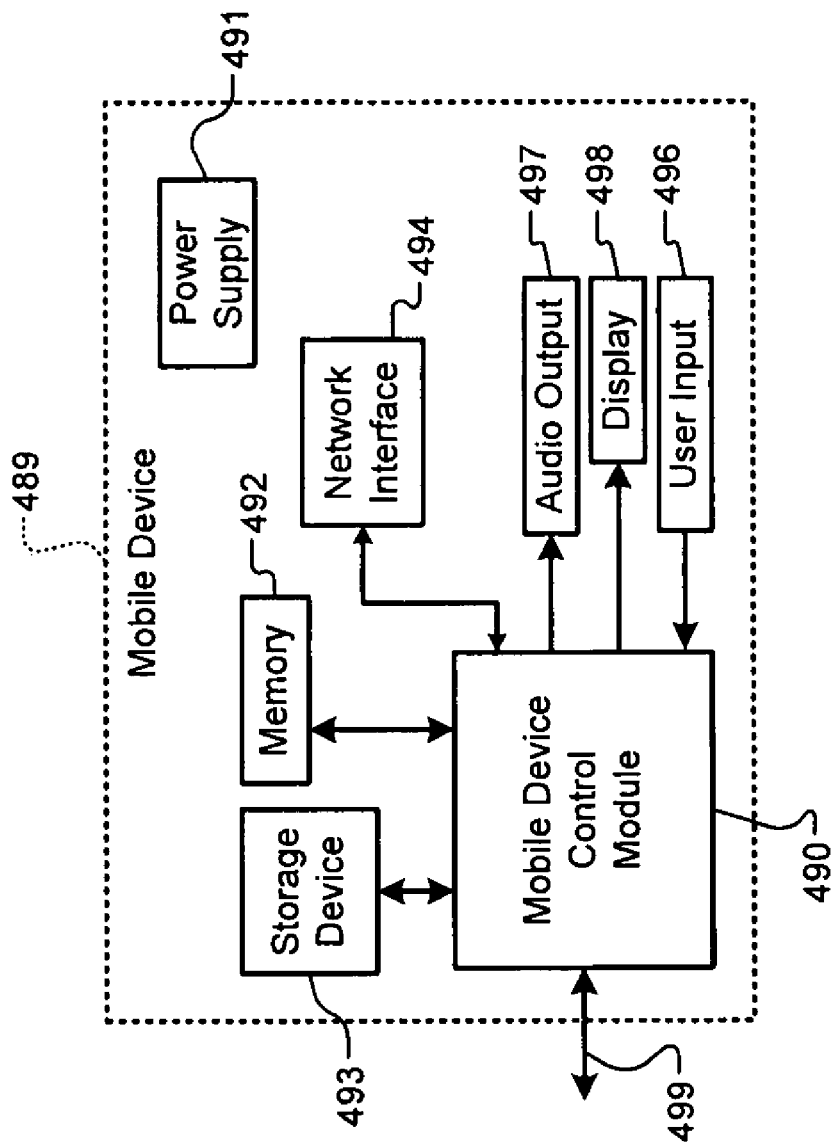
FIG. 10G is a functional block diagram of a mobile device.

Referring now to FIG. 10G, the teachings of the disclosure can be implemented to write and read back pilots to memory 492 of a mobile device 489. The mobile device 489 may include a mobile device control module 490, a power supply 491, the memory 492, a storage device 493, a network interface 494, and an external interface 499. If the network interface 494 includes a wireless local area network interface, an antenna (not shown) may be included.

The mobile device control module 490 may receive input signals from the network interface 494 and/or the external interface 499. The external interface 499 may include USB, infrared, and/or Ethernet. The input signals may include compressed audio and/or video, and may be compliant with the MP3 format. Additionally, the mobile device control module 490 may receive input from a user input 496 such as a keypad, touchpad, or individual buttons. The mobile device control module 490 may process input signals, including encoding, decoding, filtering, and/or formatting, and generate output signals.

The mobile device control module 490 may output audio signals to an audio output 497 and video signals to a display 498. The audio output 497 may include a speaker and/or an output jack. The display 498 may present a graphical user interface, which may include menus, icons, etc. The power supply 491 provides power to the components of the mobile device 489. Memory 492 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 493 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A memory system, comprising:
    a memory;
    a memory control module in communication with the memory, the memory control module including
        a selector module configured to select and switch between one of N sequences of signal levels for pilot data to be written to pilot cells in the memory of the memory system, wherein the selector module is located in the memory control module of the memory system, wherein the N sequences are different, and where N is an integer greater than 1, and
        a multiplexer module configured to selectively combine data and the pilot data and output a combined signal, wherein the multiplexer module is located in the memory control module of the memory system; and
    a write module configured to write to the memory based on the combined signal.

2. The system of claim 1, wherein first and second of the N sequences include first and second respective subsequences, wherein the first subsequence includes a highest one of the signal levels repeated M times, and the second subsequence includes a lowest one of the signal levels repeated M times, where M>1.

3. The system of claim 2, wherein the first and second of the N sequences include third and fourth respective subsequences, wherein the third and fourth subsequences include S signal levels that are between said highest and lowest ones of the signal levels, where S≧1.

4. The system of claim 3, wherein the S signal levels are different and are repeated X times, where X is an integer greater than 1.

5. The system of claim 1, wherein the selector module is configured to select from at least one of alternating between the N sequences and randomly selecting from the N sequences for subsequent write operations to multiple cells of the memory.

6. The system of claim 1, further comprising a generator module said configured to generate the pilot data.

7. The system of claim 1, further comprising:
    an encoder module configured to encode the data before the data is combined with the pilot data; and
    a decoder module configured to decode the data after the data is combined with the pilot data.

8. The system of claim 7, wherein said encoder and decoder modules are configured to operate on the data according to at least one of a Reed Solomon scheme, a Bose-Chaudhuri-Hocquenghem (BCH) scheme, a Low Density Parity Check (LDPC) scheme, a Gray code scheme, and a combination of two or more of said BCH scheme, the LDPC scheme, and the Gray code scheme.

9. The system of claim 1, wherein the memory comprises:
    a plurality of pages, wherein the plurality of pages comprise at least one of logical and physical pages; and
    a read module configured to provide read-back data and read-back pilot data from the memory.

10. The system of claim 9, wherein the write module is configured to write the pilot data to the pilot cells and the data to data cells of the memory based on a predetermined distribution.

11. The system of claim 10, wherein the predetermined distribution comprises at least one of an even distribution and a random distribution, wherein for the even distribution the pilot cells are spaced evenly apart in the memory.

12. The system of claim 10, further comprising a format module configured to determine the predetermined distribution based on at least one of a size of the physical pages and a size of the logical pages.

13. The system of claim 9, wherein the memory comprises multilevel flash memory.

14. The system of claim 9, further comprising a demultiplexer module configured to demultiplex the read-back pilot data and the read-back data.

15. The system of claim 9, further comprising an estimation module configured to estimate characteristics of the pilot cells based on the read-back pilot data.

16. The system of claim 15, further comprising a neighbor-finder module configured to process the read-back data based on the estimated characteristics.

17. The system of claim 15, wherein said the estimation module is configured to estimate the characteristics through a least-mean square (LMS) operation.

18. The system of claim 9, further comprising a signal processing module configured to compensate for variations between written data and the read-back data.

19. The system of claim 1, wherein the signal levels include pulse-amplitude modulation (PAM) levels.

20. The system of claim 2, further comprising a read module configured to determine which of the N sequences was selected for the write to the memory.

21. The system of claim 20, wherein the read module is configured to determine which of the N sequences was selected for the write to the memory based on detection of at least one of the highest one of the signal levels repeated M times and the lowest one of the signal levels repeated M times.

22. A method for operating a memory system, wherein the memory system includes i) a memory and ii) a memory control module in communication with the memory, the method comprising:
    using the memory control module of the memory system, selecting and switching between one of N sequences of signal levels for pilot data to be written to pilot cells in the memory of the memory system, wherein the N sequences are different, and where N is an integer greater than 1;
    using the memory control module of the memory system, generating a combined signal based on selectively combining data and the pilot data; and
    writing to the memory of the memory system based on the combined signal.

23. The method of claim 22, further comprising generating first and second of the N sequences including first and second respective subsequences, wherein the first subsequence includes a highest one of the signal levels repeated M times, and the second subsequence includes a lowest one of said signal levels repeated M times, where M>1.

24. The method of claim 23, wherein the first and second of the N sequences include third and fourth respective subsequences, wherein the third and fourth subsequences include S signal levels that are between the highest and lowest ones of the signal levels, where S≧1.

25. The method of claim 24, wherein the S signal levels are different and are repeated X times, where X is an integer greater than 1.

26. The method of claim 23, further comprising encoding the data before the data is combined with the pilot data, and decoding the data after the data is combined with the pilot data.

27. The method of claim 26, further comprising encoding and decoding the data according to at least one of a Reed Solomon scheme, a Bose-Chaudhuri-Hocquenghem (BCH) scheme, a Low Density Parity Check (LDPC) scheme, a Gray code scheme, and a combination of two or more of the BCH scheme, the LDPC scheme, and the Gray code scheme.

28. The method of claim 23, further comprising determining which of the N sequences was selected for the write to the memory.

29. The method of claim 28, further comprising determining which of the N sequences was selected for the write to the memory based on detection of at least one of the highest one of the signal levels repeated M times and said lowest one of the signal levels repeated M times.

30. The method of claim 22, further comprising selecting at least one of alternating between the N sequences and randomly selecting from the N sequences for subsequent write operations to multiple cells of the memory.

31. The method of claim 22, further comprising generating the pilot data.

32. The method of claim 22, further comprising providing read-back data and read-back pilot data from the memory.

33. The method of claim 32, further comprising writing the pilot data to pilot cells and the data to data cells of the memory based on a predetermined distribution.

34. The method of claim 33, wherein the predetermined distribution comprises at least one of an even distribution and a random distribution.

35. The method of claim 34, further comprising determining the predetermined distribution based on at least one of a size of a physical page and a size of a logical page of the memory.

36. The method of claim 33, wherein the memory comprises multilevel flash memory.

37. The method of claim 33, further comprising demultiplexing the read-back pilot data and the read-back data.

38. The method of claim 33, further comprising estimating characteristics of pilot cells based on the read-back pilot data.

39. The method of claim 38, further comprising processing the read-back data based on the estimated characteristics.

40. The method of claim 39, further comprising estimating the characteristics through a least-mean square (LMS) operation.

41. The method of claim 33, further comprising compensating for variations between written data and the read-back data.

42. The method of claim 22, wherein the signal levels include pulse-amplitude modulation (PAM) levels.

* * * * *